United States Patent
Pagaila et al.

(10) Patent No.: US 7,618,846 B1
(45) Date of Patent: Nov. 17, 2009

(54) SEMICONDUCTOR DEVICE AND METHOD OF FORMING SHIELDING ALONG A PROFILE DISPOSED IN PERIPHERAL REGION AROUND THE DEVICE

(75) Inventors: Reza A. Pagaila, Singapore (SG); Byung Tai Do, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/140,092

(22) Filed: Jun. 16, 2008

(51) Int. Cl.
*H01L 21/44* (2006.01)
*H01L 21/48* (2006.01)
*H01L 21/50* (2006.01)

(52) U.S. Cl. ............... 438/113; 438/462; 257/E21.599

(58) Field of Classification Search ............. 438/110, 438/113, 114, 119, 460, 462; 257/E21.599, 257/E21.6
See application file for complete search history.

(56) References Cited

U.S. PATENT DOCUMENTS 6,838,748 B2    1/2005   Ishio et al.
6,900,079 B2 *  5/2005   Kinsman et al. ............ 438/127
2007/0267725 A1  11/2007  Lee et al.

* cited by examiner

*Primary Examiner*—Hoai v Pham
(74) *Attorney, Agent, or Firm*—Robert D. Atkins

(57) ABSTRACT

A semiconductor device has a semiconductor die with a peripheral region around the die. A first insulating material is deposited in the peripheral region. A conductive via is formed through the first insulating material. A conductive layer is formed over the semiconductor die. The conductive layer is electrically connected between the conductive via and a contact pad of the semiconductor die. A second insulating layer is deposited over the first insulating layer, conductive layer, and semiconductor die. A profile is formed in the first and second insulating layers in the peripheral region. The profile is tapered, V-shaped, truncated V-shape, flat, or vertical. A shielding layer is formed over the first and second insulating layers to isolate the semiconductor die from inter-device interference. The shielding layer conforms to the profile in the peripheral region and electrically connects the shielding layer to the conductive via.

19 Claims, 11 Drawing Sheets

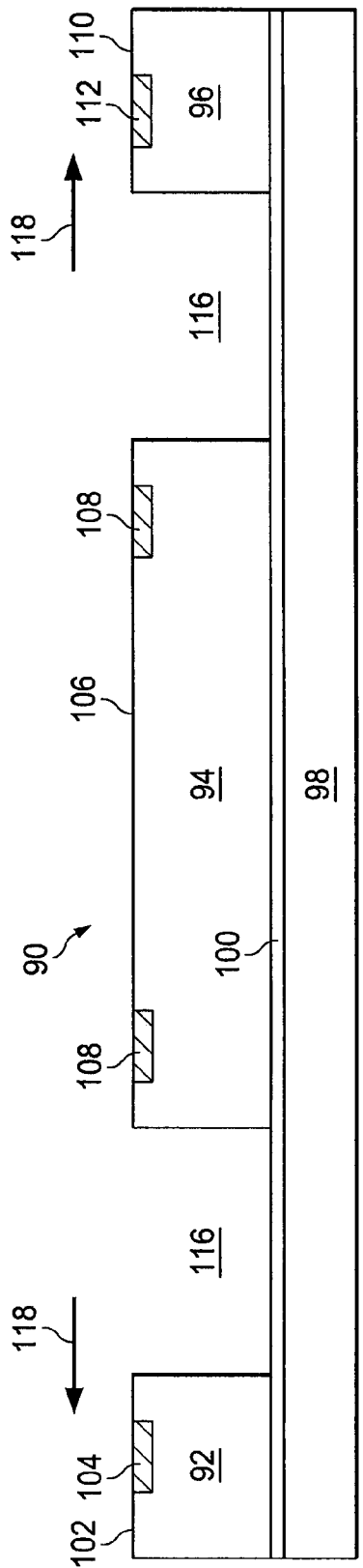
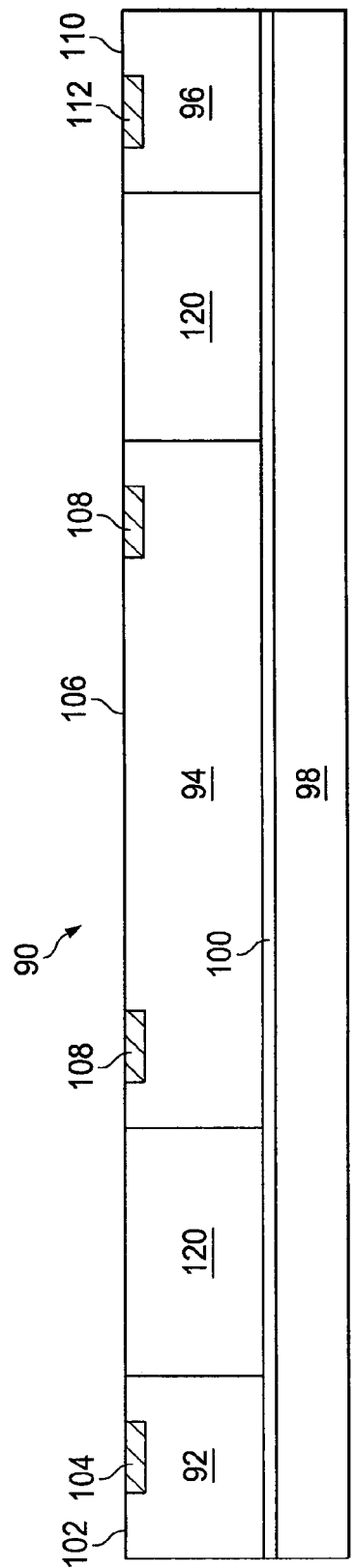
FIG. 3c
FIG. 3d

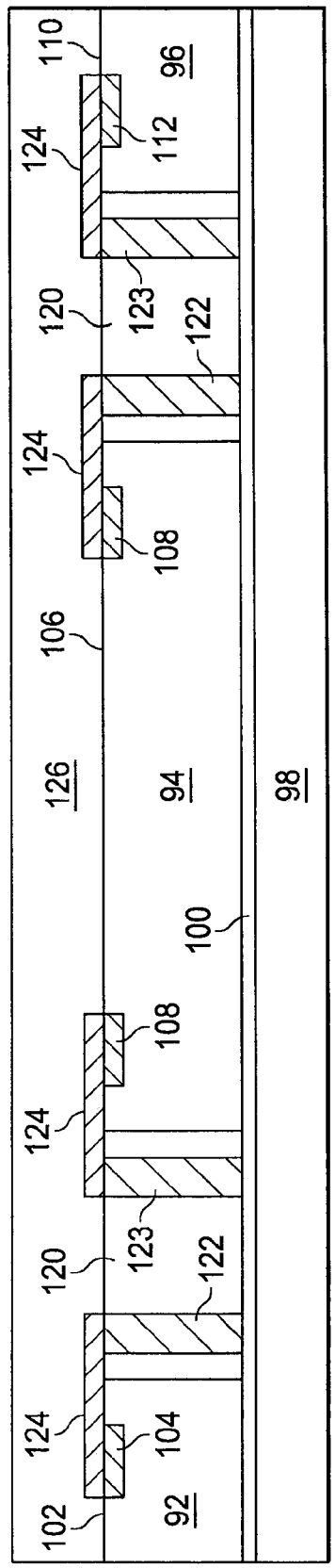
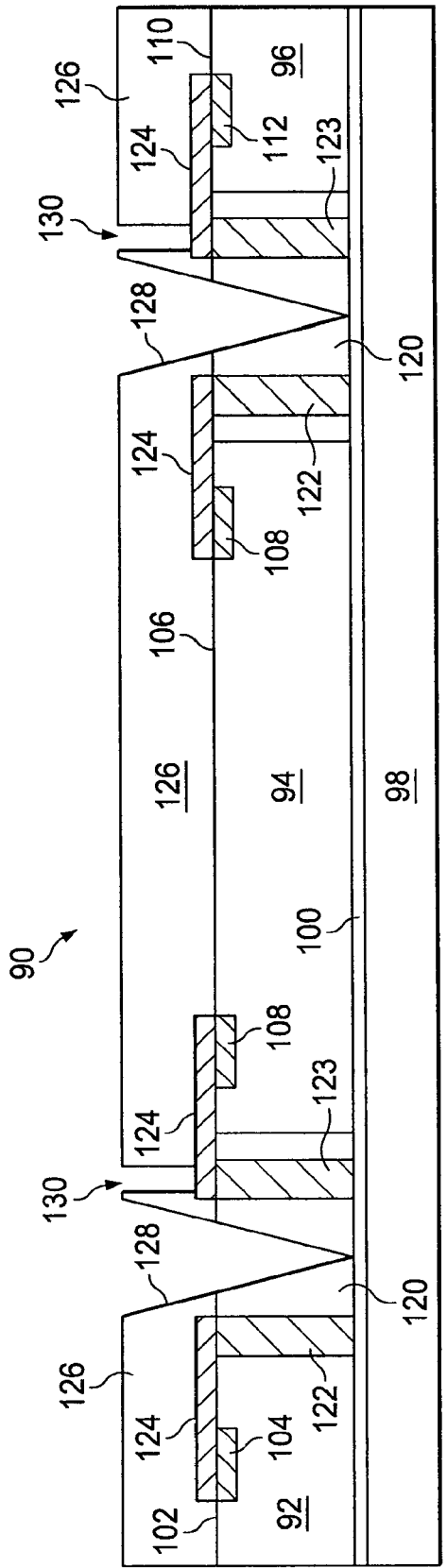

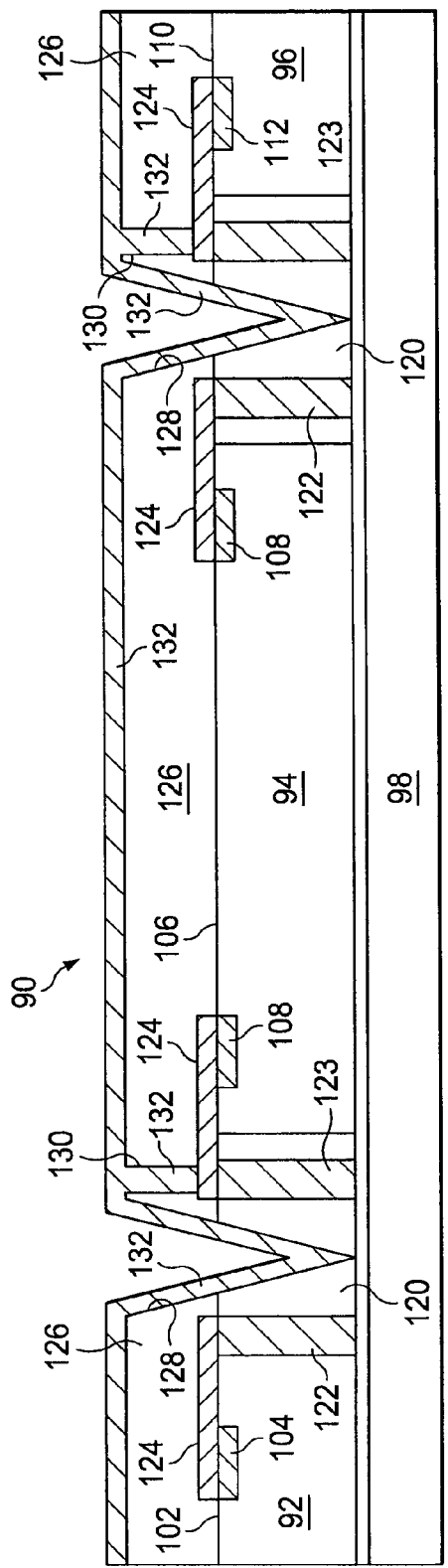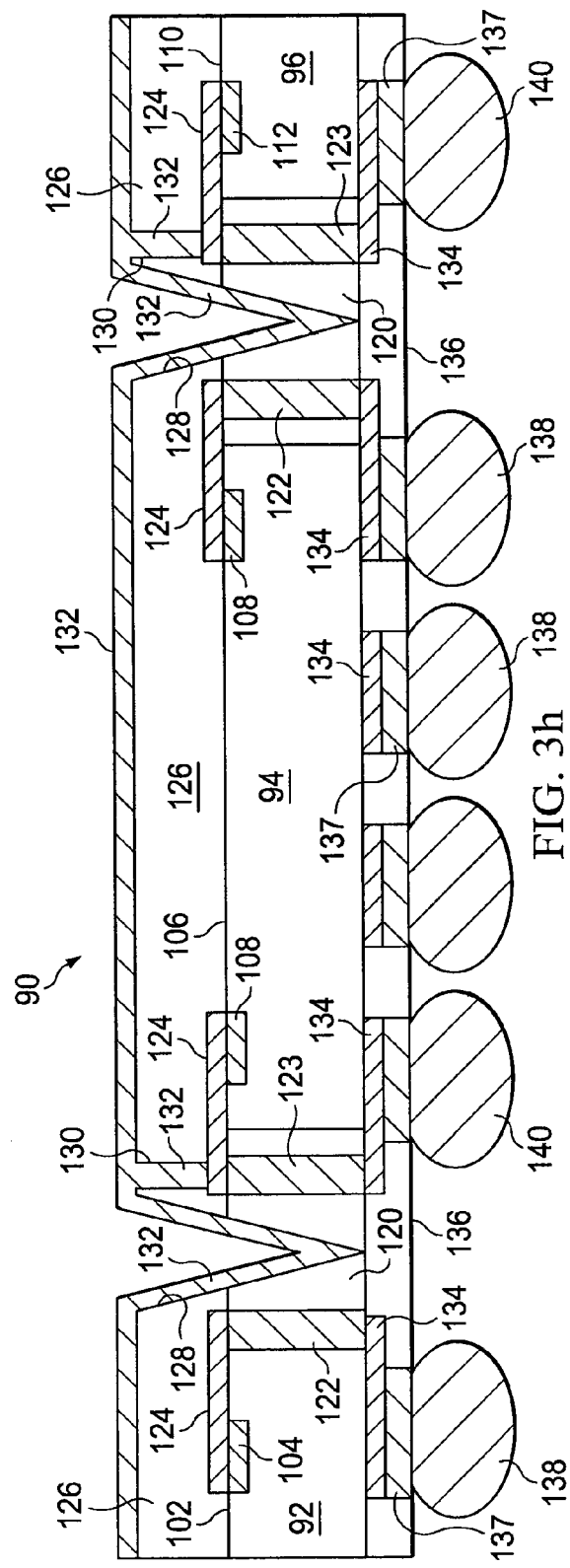

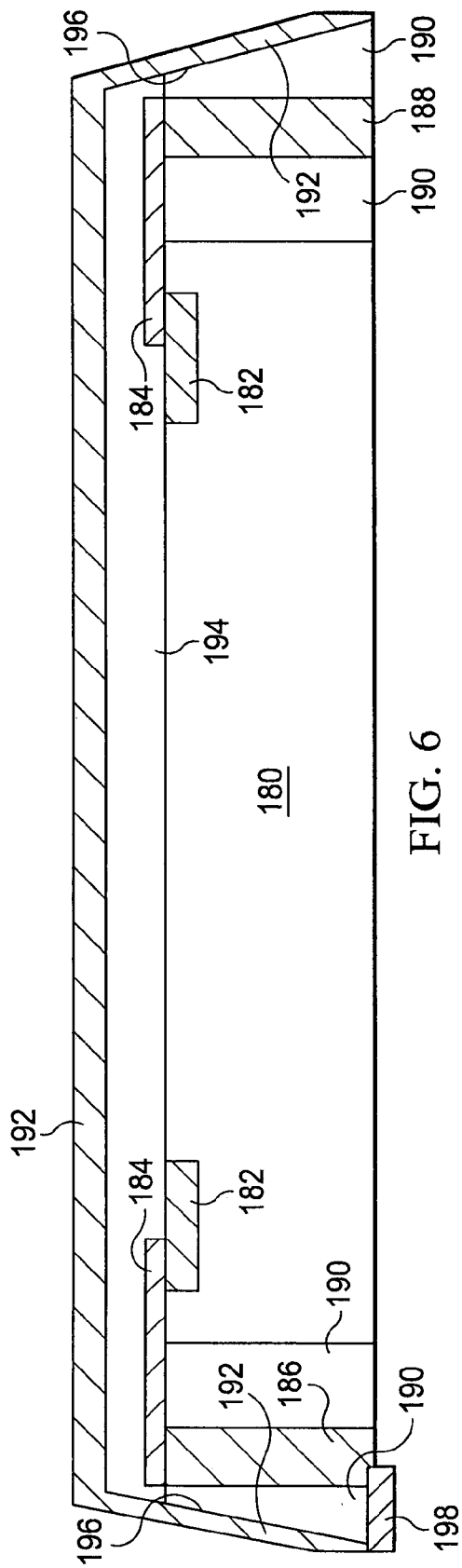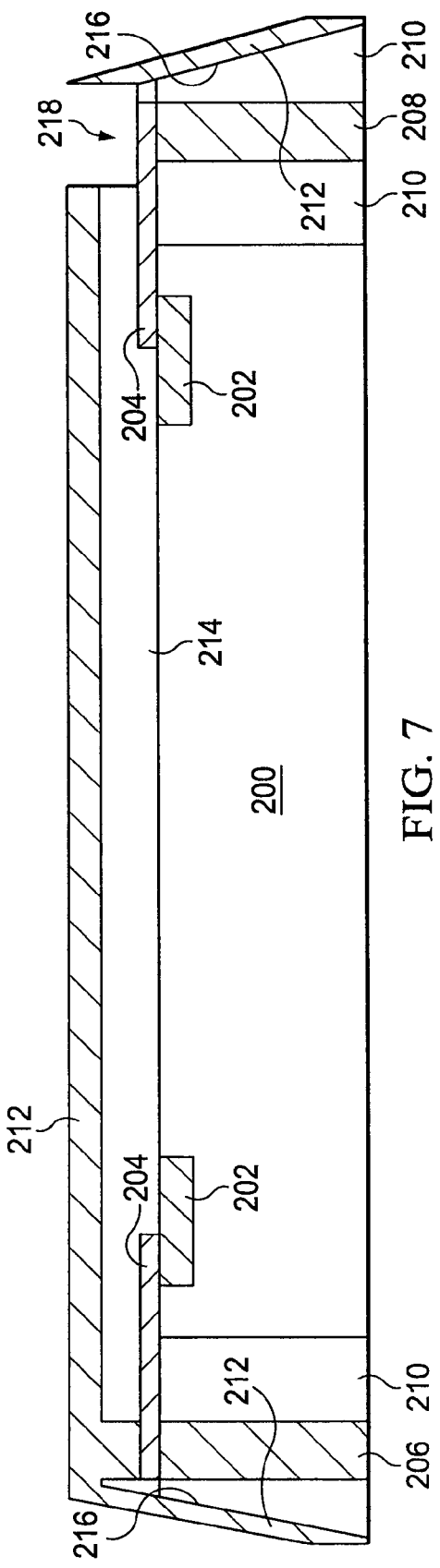

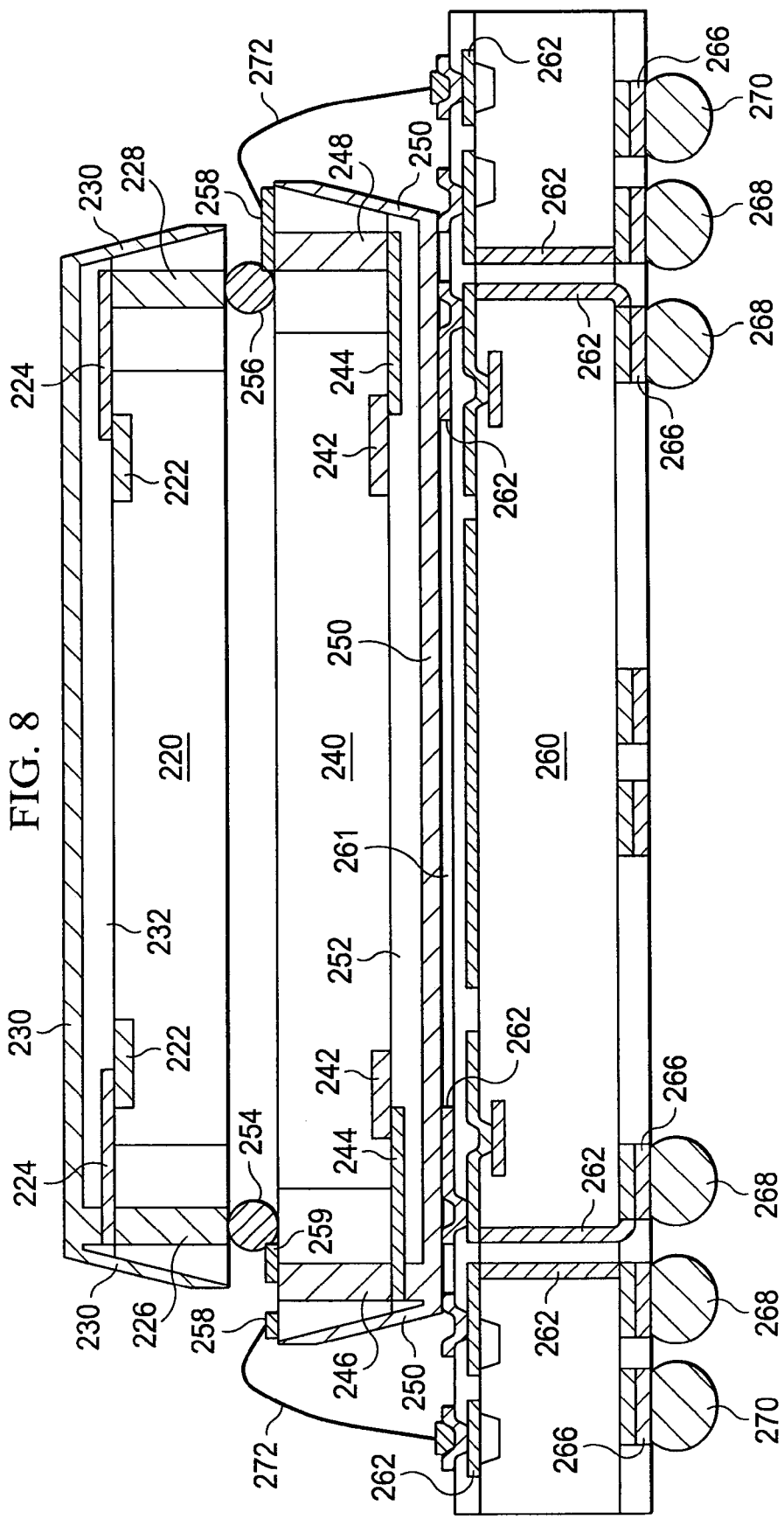

US 7,618,846 B1

SEMICONDUCTOR DEVICE AND METHOD OF FORMING SHIELDING ALONG A PROFILE DISPOSED IN PERIPHERAL REGION AROUND THE DEVICE

FIELD OF THE INVENTION

The present invention relates in general to semiconductor devices and, more particularly, to a semiconductor device and method of forming a shielding layer along a profile disposed in a peripheral region around the device.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

SUMMARY OF THE INVENTION

A need exists for a stackable semiconductor device with a shielding layer and conductive via formed in a peripheral region around the device. Accordingly, in one embodiment, the present invention is a method of making a semiconductor device comprising the steps of providing a semiconductor wafer having a plurality of semiconductor die, creating a gap between the semiconductor die to provide a peripheral region around the semiconductor die, depositing a first insulating material in the gap, forming a conductive via through the first insulating material in the gap, and forming a conductive layer over the first insulating layer and semiconductor die. The conductive layer is electrically connected to the conductive via and a contact pad of the semiconductor die. The method further includes the steps of depositing a second insulating layer over the first insulating layer, conductive layer, and semiconductor die, forming a profile in the first and second insulating layers in the peripheral region around the semiconductor die, forming an opening in the second insulating layer to expose the conductive layer, and forming a shielding layer over the first and second insulating layers to isolate the semiconductor die from inter-device interference. The shielding layer conforms to the profile in the peripheral region around the semiconductor die and to the opening to electrically connect the shielding layer to the conductive via. The method further includes the step of singulating the semiconductor wafer to separate the semiconductor die.

In another embodiment, the present invention is a method of making a semiconductor device comprising the steps of creating a gap between a plurality of semiconductor die which provides a peripheral region around the semiconductor die, depositing a first insulating material in the gap, forming a conductive via through the first insulating material in the gap, depositing a second insulating layer over the first insulating layer and semiconductor die, forming a profile in the first and second insulating layers in the peripheral region around the semiconductor die, and forming a shielding layer over the first and second insulating layers to isolate the semiconductor die from inter-device interference. The shielding layer conforms to the profile in the peripheral region around the semiconductor die and is electrically connected to the conductive via.

In another embodiment, the present invention is a method of making a semiconductor device comprising the steps of providing a semiconductor die having a peripheral region, depositing a first insulating material in the peripheral region, forming a conductive via through the first insulating material, depositing a second insulating layer over the first insulating layer and semiconductor die, forming a profile in the first and second insulating layers in the peripheral region around the semiconductor die, and forming a shielding layer over the first and second insulating layers to isolate the semiconductor die from inter-device interference. The shielding layer conforms to the profile in the peripheral region around the semiconductor die and is electrically connected to the conductive via.

In another embodiment, the present invention is a semiconductor device comprising a semiconductor die having a peripheral region. A first insulating material is formed in the peripheral region. A conductive via is formed through the first insulating material in the peripheral region around the semiconductor die. A second insulating layer is formed over the first insulating layer and semiconductor die. A shielding layer is formed over the first and second insulating layers to isolate the semiconductor die from inter-device interference. The shielding layer conforms to a profile in the peripheral region around the semiconductor die and is electrically connected to the conductive via.

BRIEF DESCRIPTION OF THE DRAWINGS

FIGS. 3a-3h illustrate a process of forming a shielding layer formed along a V-shaped profile in peripheral region around the die;

FIG. 6 illustrates the semiconductor device with a shielding layer formed along V-shaped profile and having an interconnect through conductive vias and backside RDL;

FIG. 7 illustrates the semiconductor device with a shielding layer formed along V-shaped profile and having an opening over conductive vias;

FIG. 8 illustrates vertically stacked semiconductor die each with a shielding layer formed along V-shaped profile;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
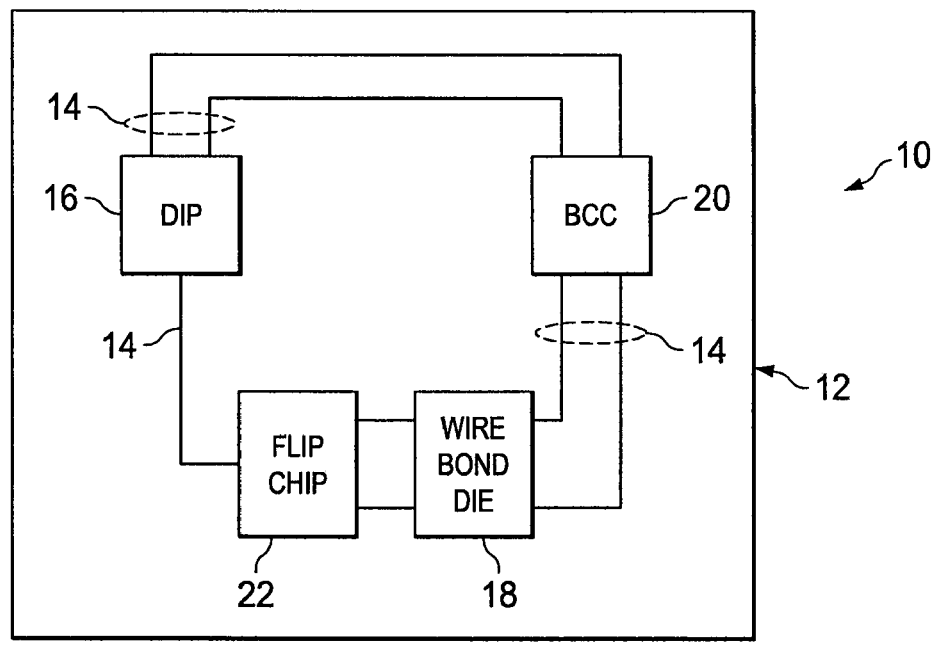
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
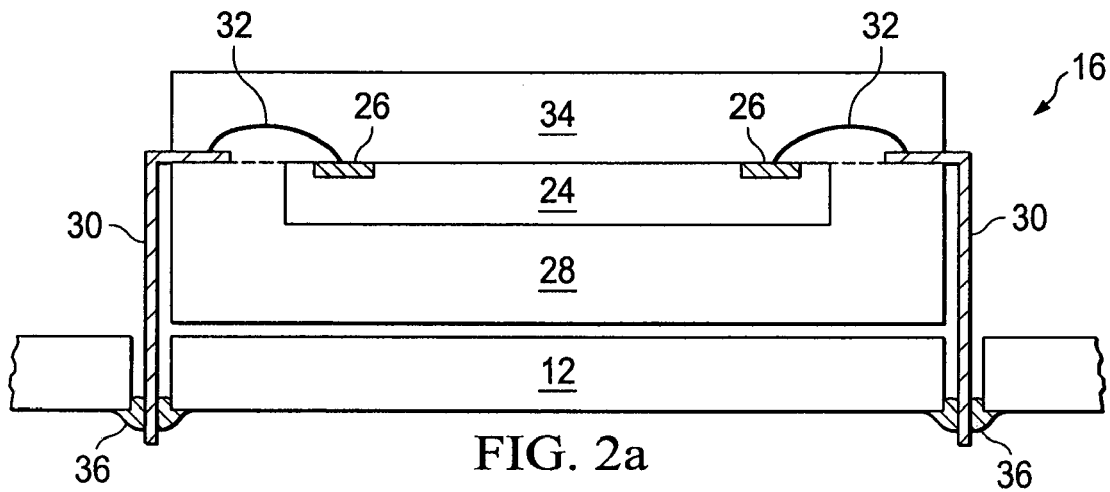
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. An encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
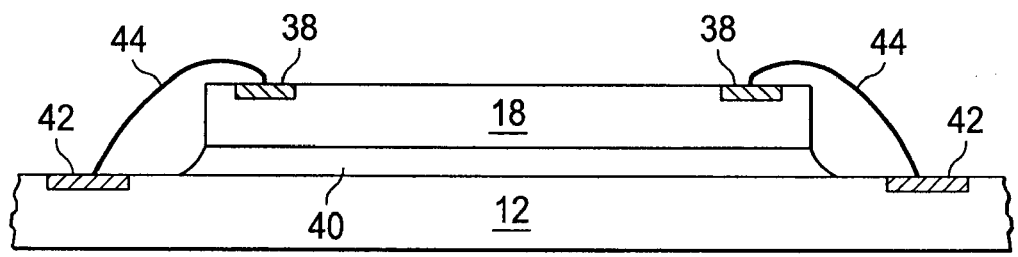

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
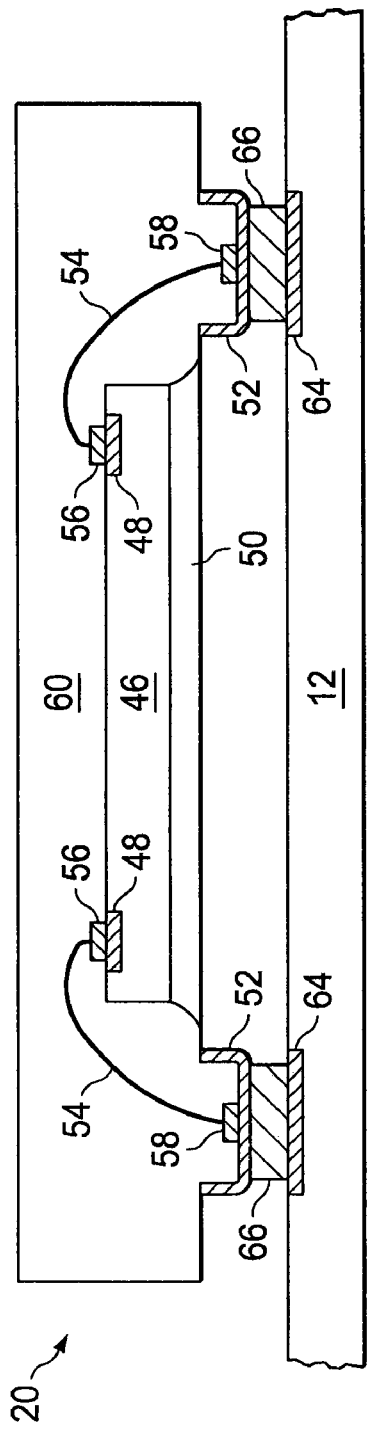

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
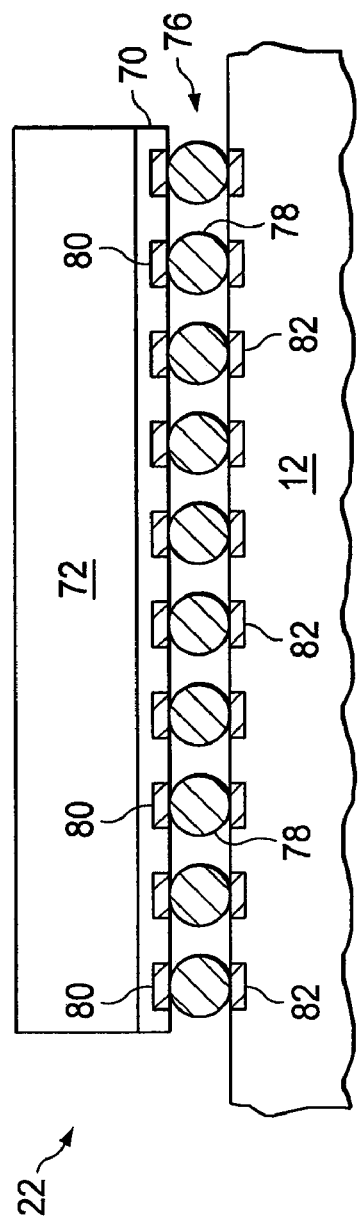

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72, is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
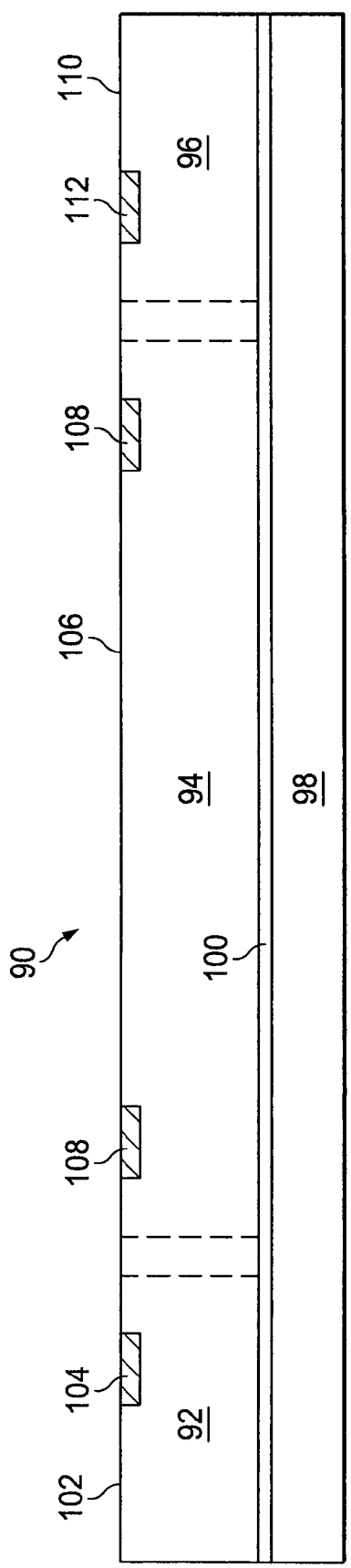

FIGS. 3a-3h illustrate a process of forming conductive vias in a peripheral region around a semiconductor die in a wafer level chip scale package (WLCSP). To start the process, a plurality of semiconductor die is formed on a semiconductor wafer 90 using conventional integrated circuit processes, as described above. The first semiconductor wafer, containing semiconductor die 92, 94, and 96, is mounted to expansion table 98 with ultraviolet (UV) tape 100, as shown in FIG. 3a. The backside of semiconductor die 92 is affixed to expansion table 98 with its active surface 102 and contact pads 104 oriented face up. Likewise, the backside of semiconductor die 94 is mounted to expansion table 98 with its active surface 106 and contact pads 108 oriented face up. The backside of semiconductor die 96 is mounted to expansion table 98 with its active surface 110 and contact pads 112 oriented face up. Contact pads 104, 108, and 112 electrically connect to active and passive devices and signal traces in active areas 102, 106, and 110 of semiconductor die 92, 94, and 96, respectively.

Semiconductor die 92-96 may contain baseband circuits that are susceptible to electromagnetic interference (EMI), radio frequency interference (RFI), or other inter-device interference. In other embodiments, semiconductor die 92-96 contain integrated passive devices (IPD) that generate EMI, RFI, and inter-device interference. For example, the IPDs contained within semiconductor die 92-96 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. In such systems, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal. Therefore, each of these passive circuit elements has the potential to adversely influence the electrical function of adjacent devices.

Figure 3B:
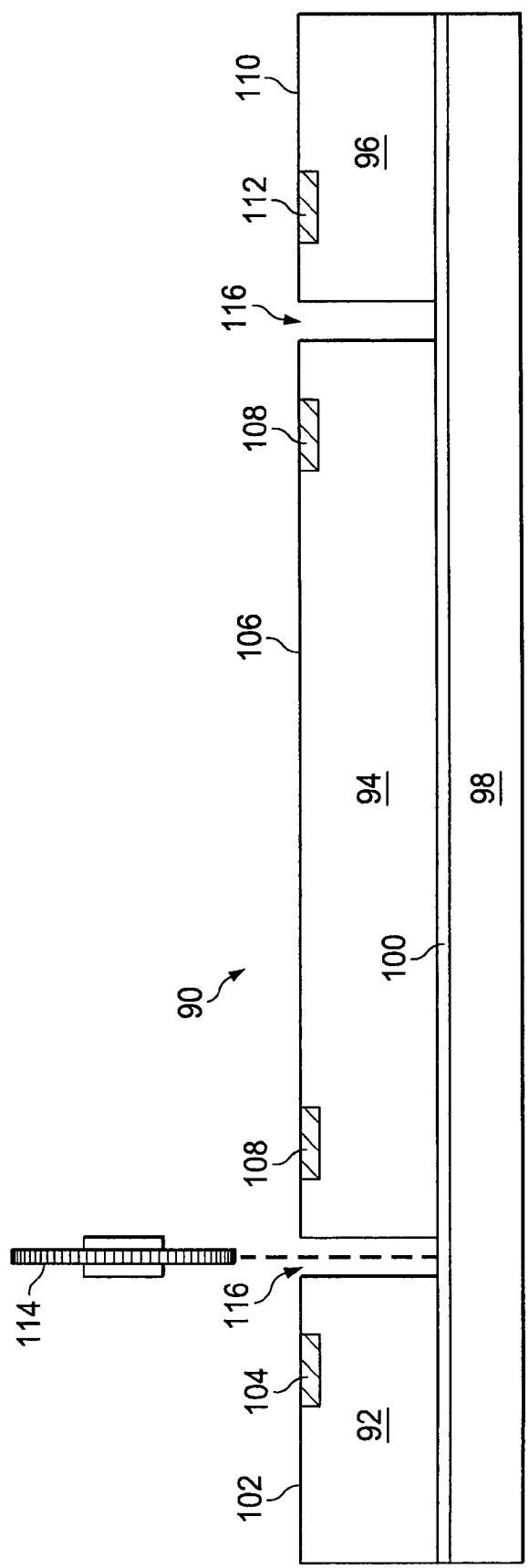

In FIG. 3b, a saw blade or laser tool 114 cuts through saw street 116 between semiconductor die 92 and 94, and through saw street 116 between semiconductor die 94 and 96, in a dicing operation. Expansion table 98 moves in two-dimension lateral directions, as shown by arrows 118 in FIG. 3c, to expand the width of saw streets 116, i.e., form a gap to create a greater physical separation between the die. Expansion table 98 moves substantially the same distance in the x-axis and y-axis to provide equal separation around a peripheral region of each die. The post-expansion width of saw street or gap 116 ranges from 5 micrometers ($\mu$m) to 200 $\mu$m. The expanded dimension depends on the design embodiment, i.e., half-via, full-via, single row via, or double/multiple row via. The expanded saw street or gap 116 define a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form conductive vias within the gap, as described below.

In FIG. 3d, an organic insulating material 120 is deposited in gap 116 using spin coating, needle dispensing, or other suitable application process. Organic material 120 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 116. The non-conductive materials can also be deposited using a transfer molding or injection molding process.

In FIG. 3e, a portion of organic material 120 is removed by laser drilling or etching to create openings that extend down to expansion table 98. The openings can be vertical or tapered. An electrically conductive material is deposited into the openings to form conductive though hole vias (THV) 122 and 123 using a PVD, CVD, evaporation, electrolytic plating, electroless plating, screen printing, or other suitable metal deposition process. The conductive material can be made with metals such as Al, Cu, Sn, Ni, Au, Ag, or other suitable electrically conductive material.

An electrically conductive layer 124 is patterned and deposited on active surfaces 102, 106, and 110 of semiconductor die 92, 94, and 96, respectively, as well as organic material 120. Conductive layer 124 can be deposited by using a PVD, CVD, evaporation, electrolytic plating, electroless plating, screen printing, or other suitable metal deposition process. Conductive layer 124 can be made with Al, Cu, Sn, Ni, Au, Ag, or other suitable electrically conductive material. Conductive layer 124 is a redistribution layer (RDL) that electrically connects contact pads 104, 108, and 112 to THVs 122 and 123 as shown.

An insulating material 126 is formed over the active surfaces of semiconductor die 92-96 and conductive layer 124 for structural support and physical isolation. The insulating layer 126 can be made with nitride (SiN), silicon dioxide (SiO2), silicon oxynitride (SiON), tantalum pentoxide (Ta2O5), zircon (ZrO2), aluminum oxide (Al2O3), polyimide (PI), benzocyclobutene (BCB), polybenzoxazole (PBO), or other suitable insulating material. The deposition of insulating layer 126 may involve PVD, CVD, printing, sintering, or thermal oxidation.

In FIG. 3f, a tapered or V-shaped profile 128 is formed in insulating layer 126 and organic material 120 using an etching process. Profile 128 extends down to expansion table 98. Alternatively, profile 128 can be truncated V-shape, vertical, flat, or curved in shape. Another portion of insulating layer 126 is removed using an etching process to form opening 130 and expose conductive layer 124 over conductive THV 123.

In FIG. 3g, an electrically conductive shielding layer 132 with an optional seed layer is conformally deposited over insulating layer 126 and organic material 120. Shielding layer 132 extends into profile 128 and opening 130 and electrically connects to conductive layer 124 and conductive THV 123. Shielding layer 132 can be Cu, Al, stainless steel, nickel silver, low-carbon steel, silicon-iron steel, foil, epoxy, conductive resin, and other metals and composites capable of blocking EMI, RFI, and other externally generated interference. The seed layer can be made with Cu, Ni, nickel vanadium (NiV), Au, or Al. The seed layer and shielding layer 132 are patterned and conformally deposited using an electrolytic plating, electroless plating, sputtering, PVD, CVD, or other suitable metal deposition process. For non-metal materials, shielding layer 132 can be applied by lamination, spraying, or painting.

Shielding layer 132 substantially covers all areas of insulating layer 126 relative to the top of semiconductor die 92-96 to provide isolation from EMI, RFI, or other inter-device interference. The interference can be generated internally or originating from external semiconductor devices containing IPDs or RF circuits. By virtue of profile 128 being cut into organic material 120 and shielding layer 132 extending into the profile, the shielding layer also isolates the sides of semiconductor die 92-96 from EMI, RFI, or other inter-device interference.

Organic material 120 and insulating layer 126 must be sufficiently thick to maintain structural integrity of conductive THVs 122 and 123 and conductive layer 124 after depositing shielding layer 132. A thick insulating layer 126 also reduces crosstalk and other interference between shielding layer 132 and conductive layer 124.

In FIG. 3h, semiconductor wafer 90 is removed from expansion table 98. An interconnect structure is formed on a backside of semiconductor die 92-96, opposite active surfaces 102, 106, and 110. The interconnect structure includes an electrically conductive layer which is patterned and deposited to form RDL 134. Conductive layer 134 can be deposited by using a PVD, CVD, evaporation, electrolytic plating, electroless plating, screen printing, or other suitable metal deposition process. Conductive layer 134 can be made with Al, Cu, Sn, Ni, Au, Ag, or other suitable electrically conductive material. RDL 134 electrically connects to conductive THVs 122 and 123.

An insulating layer 136 is formed over RDL 134 and the backside of semiconductor die 92-96 for structural support and physical isolation. The insulating layer 136 can be made with Si3N4, SiO2, SiON, Ta2O5, zirconium oxide (ZrO2), or other suitable dielectric material. The deposition of insulating layer 136 may involve PVD, CVD, printing, sintering, or thermal oxidation. A portion of insulating layer 136 is removed by an etching process to expose RDL 134. Contact pads 137 are then formed on RDL 134.

An electrically conductive solder material is deposited over contact pads 137 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 138 and 140. In some applications, solder bumps 138 and 140 are reflowed a second time to improve electrical contact to contact pads 137. Solder bumps 140 are electrically connected to an external low-impedance ground point to aid in the shielding feature of layer 132. As an alternative interconnect structure, bond wires or solder paste can be used for the external interconnect including the ground connection.

Semiconductor die 92-96 are singulated through a center portion of gap 116, i.e., through a center portion of profile 128. The gap region 116 is cut by a cutting tool such as a saw blade or laser. The cutting tool completely severs the gap region to separate the die.

Figure 4:
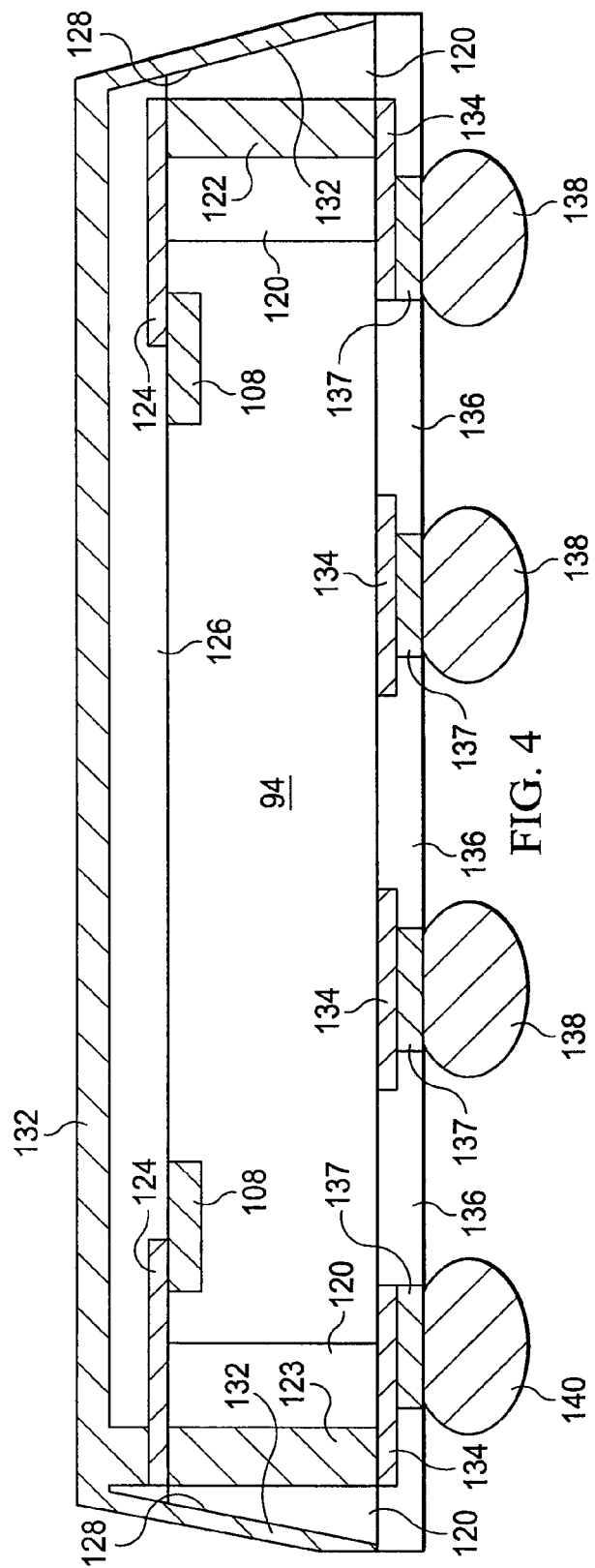
FIG. 4 illustrates the semiconductor device with a shielding layer formed along V-shaped profile and having a backside interconnect structure.

FIG. 4 shows a final configuration for semiconductor die 94. Contact pads 108 electrically connect through conductive layer 124 to conductive THVs 122 and 123 which are formed in organic material 120. Shielding layer 132 is formed over insulating layer 126. Shielding layer 132 also conforms to V-shaped profile 128. Shielding layer 132 electrically connects to an external ground point through conductive layer 124, conductive THVs 123, RDL 134, contact pads 137, and solder bump 140. Shielding layer 132 substantially covers all areas of insulating layer 126 relative to the top of semiconductor die 92-96 to provide isolation from EMI, RFI, or other inter-device interference. By virtue of profile 128 being cut into organic material 120 and shielding layer 132 extending into the profile, the shielding layer also isolates the sides of semiconductor die 94 from EMI, RFI, or other inter-device interference. Other electrical signals are routed to and from semiconductor die 94 through contact pads 108, conductive layer 124, conductive THV 122, RDL 134, contact pads 137, and solder bumps 138.

Figure 5:
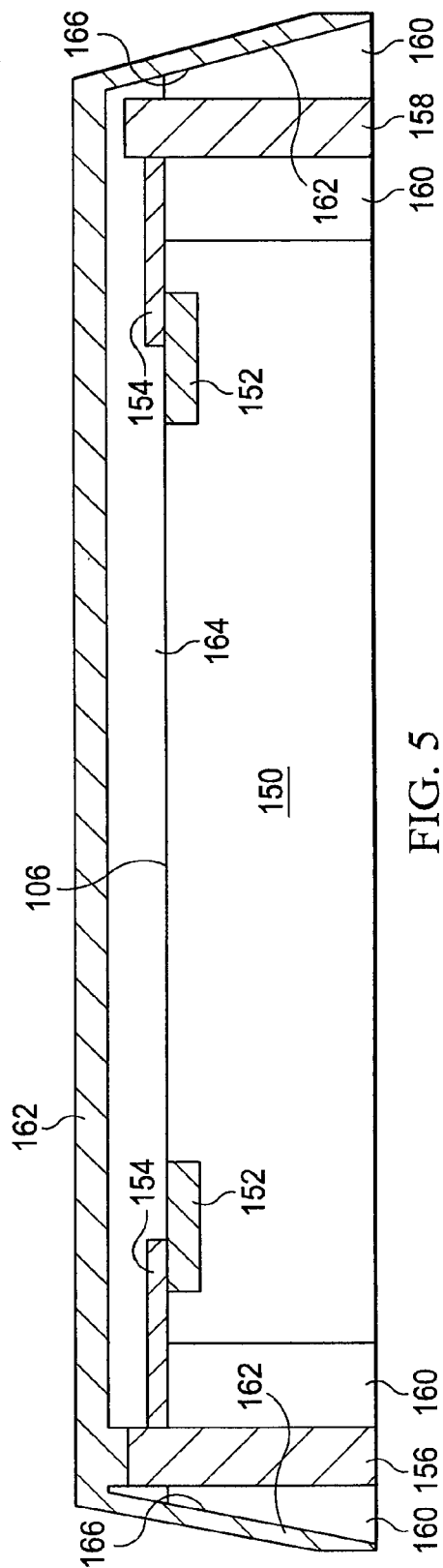
FIG. 5 illustrates the semiconductor device with a shielding layer formed along V-shaped profile and having an interconnect through conductive vias.

In an alternate embodiment of the shielded semiconductor device as shown in FIG. 5, semiconductor die 150 includes contact pads 152 which are electrically connected through conductive layer 154 to conductive THVs 156 and 158 which are formed in organic material 160. Conductive THVs 156 and 158 protrude into insulating material 164. Shielding layer 162 is formed over insulating layer 164. Shielding layer 162 also conforms to V-shaped profile 166. Shielding layer 162 electrically connects to an external ground point through conductive THV 156. In this embodiment, the external interconnectivity is achieved directly through protruding conductive THVs 156 and 158. Shielding layer 162 substantially covers all areas of insulating layer 164 relative to the top of semiconductor die 150 to provide isolation from EMI, RFI, or other inter-device interference. By virtue of profile 166 being cut into organic material 160 and shielding layer 162 extending into the profile, the shielding layer also isolates the sides of semiconductor die 150 from EMI, RFI, or other inter-device interference. Other electrical signals are routed to and from semiconductor die 150 through contact pads 152, conductive layer 154, and conductive THV 158.

FIG. 6 shows semiconductor die 180 with contact pads 182 electrically connected through conductive layer 184 to conductive THVs 186 and 188 which are formed in organic material 190. Shielding layer 192 is formed over insulating layer 194. Shielding layer 192 also conforms to V-shaped profile 186. A backside RDL 198 electrically connects to an external ground point. Thus, shielding layer 182 electrically connects to the external ground point through RDL 198. Shielding layer 192 substantially covers all areas of insulating layer 194 relative to the top of semiconductor die 180 to provide isolation from EMI, RFI, or other inter-device interference. By virtue of profile 196 being cut into organic material 190 and shielding layer 192 extending into the profile, the shielding layer also isolates the sides of semiconductor die 180 from EMI, RFI, or other inter-device interference. Other electrical signals are routed to and from semiconductor die 180 through contact pads 182, conductive layer 184, and conductive THV 188.

In FIG. 7, semiconductor die 200 includes contact pads 202 electrically connected through conductive layer 204 to conductive THVs 206 and 208 which are formed in organic material 210. Shielding layer 212 is formed over insulating layer 214. Shielding layer 212 also conforms to V-shaped profile 216. A portion of shielding layer 212 and insulating layer 214 is removed by an etching process to form opening 218 and expose conductive layer 204 over conductive THV 208. Opening 218 can be circular, rectangular, oval, or other irregular shapes. Shielding layer 212 electrically connects to an external ground point through conductive layer 204 and conductive THV 206. Shielding layer 212 substantially covers all areas of insulating layer 214 relative to the top of semiconductor die 200 to provide isolation from EMI, RFI, or other inter-device interference. By virtue of profile 216 being cut into organic material 210 and shielding layer 212 extending into the profile, the shielding layer also isolates the sides of semiconductor die 200 from EMI, RFI, or other inter-device interference. Other electrical signals are routed to and from semiconductor die 200 through contact pads 202, conductive layer 204, and conductive THV 208. Opening 218 provides interconnect access to conductive layer 204 for stacking semiconductor die.

The aforedescribed semiconductor die covered by the shielding layer can be readily integrated into package-in-package (PiP) applications, as shown in FIG. 8. Semiconductor die 220 includes contact pads 222 electrically connected through conductive layer 224 to conductive THVs 226 and 228 which are formed in the organic material occupying the peripheral region around semiconductor die 220. Shielding layer 230 is formed over insulating layer 232. Shielding layer 230 also conforms to the V-shaped profile which is also formed in the organic material occupying the peripheral region around semiconductor die 220. Shielding layer 230 substantially covers all areas of insulating layer 232 relative to the top of semiconductor die 220 to provide isolation from EMI, RFI, or other inter-device interference. By virtue of the V-shaped profile being cut into the organic material and shielding layer 230 extending into the profile, the shielding layer also isolates the sides of semiconductor die 220 from EMI, RFI, or other inter-device interference.

Semiconductor die 240 includes contact pads 242 electrically connected through conductive layer 244 to conductive THVs 246 and 248 which are formed in the organic material occupying the peripheral region around semiconductor die 240. Shielding layer 250 is formed over insulating layer 252. Shielding layer 250 also conforms to the V-shaped profile which is formed in the organic material occupying the peripheral region around semiconductor die 240. Shielding layer 250 substantially covers all areas of insulating layer 252 relative to the top of semiconductor die 240 to provide isolation from EMI, RFI, or other inter-device interference. By virtue of the V-shaped profile being cut into the organic material and shielding layer 250 extending into the profile, the shielding layer also isolates the sides of semiconductor die 240 from EMI, RFI, or other inter-device interference.

Semiconductor die 220 and 240 are vertically stacked and electrically connected by solder bumps 254 and 256 and interconnect structure and RDL 258 and 259. Alternately, semiconductor die 220 and 240 can be electrically interconnected with solder paste. Semiconductor die 220 and 240 can be the same size or different size. The stacked semiconductor die are mounted to a top side of substrate 260 with an adhesive layer 261, such as thermal epoxy, polymer composite, or inorganic bonding compounds. Substrate 260 can be laminate, embedded die substrate, ceramics, or leadframe. Substrate 260 has an interconnect structure 262 including signal traces, conductive layers, and dielectric layers. Contact pads 266 are formed on a backside of substrate 260 with electrical connection to interconnect structure 262. Solder bumps 268 and 270 are formed on contact pads 266.

Shielding layer 230 electrically connects to shielding layer 250 through conductive layer 224, conductive THV 226, solder bump 254, RDL 259, conductive THV 246, and conductive layer 244. Shielding layer 250 electrically connects to an external ground point through interconnect structure 262, contact pads 266 and solder bumps 268. Thus, shielding layers 230 and 250 are both connected to the external ground point through a common conductive path, i.e., interconnect structure 262, contact pads 266 and solder bump 268. Other electrical signals are routed to and from semiconductor die 220 and 240 through contact pads 222 and 242, conductive layers 224 and 244, conductive THVs 228 and 248, solder bumps 256, and RDL 258. The electrical signals are also routed to substrate 260 through bond wires 272 connected to RDLs 258. Bond wires 272 electrically connect to interconnect structure 262, contact pads 266, and solder bumps 270 for external interconnectivity of the electrical signals.

Figure 9:
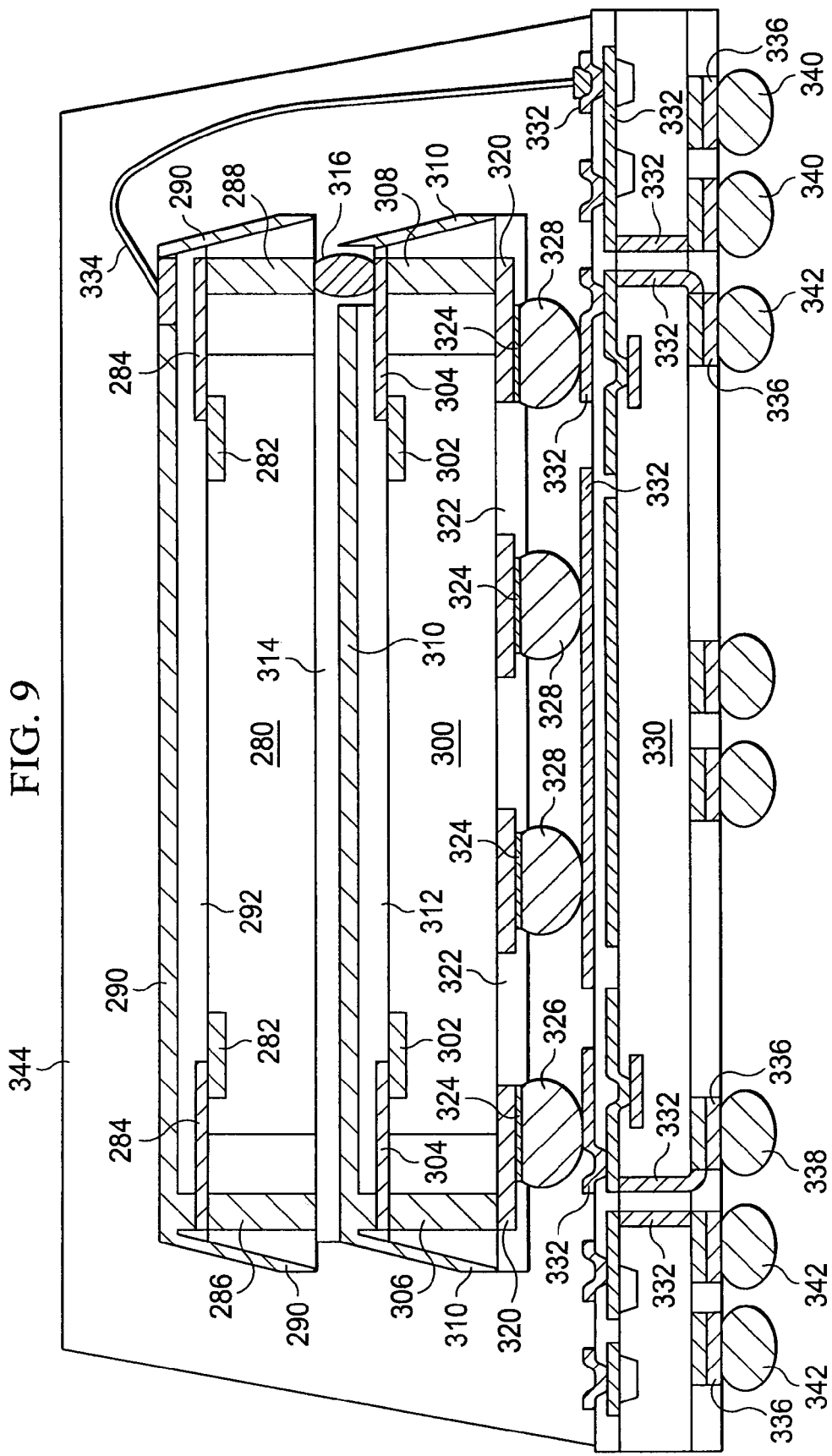
FIG. 9 illustrates vertically stacked semiconductor die each with a shielding layer formed along V-shaped profile and having separate connection to external ground point.

FIG. 9 shows another PiP embodiment where each shielding layer has a separate electrical connection to the external ground point. Semiconductor die 280 includes contact pads 282 electrically connected through conductive layer 284 to conductive THVs 286 and 288 which are formed in the organic material occupying the peripheral region around semiconductor die 280. Shielding layer 290 is formed over insulating layer 292. Shielding layer 290 also conforms to the V-shaped profile which is also formed in the organic material occupying the peripheral region around semiconductor die 280. Shielding layer 290 substantially covers all areas of insulating layer 292 relative to the top of semiconductor die 280 to provide isolation from EMI, RFI, or other inter-device interference. By virtue of the V-shaped profile being cut into the organic material and shielding layer 290 extending into the profile, the shielding layer also isolates the sides of semiconductor die 280 from EMI, RFI, or other inter-device interference.

Semiconductor die 300 includes contact pads 302 electrically connected through conductive layer 304 to conductive THVs 306 and 308 which are formed in the organic material occupying the peripheral region around semiconductor die 300. Shielding layer 310 is formed over insulating layer 312. Shielding layer 310 also conforms to the V-shaped profile which is formed in the organic material occupying the peripheral region around semiconductor die 300. Shielding layer 310 substantially covers all areas of insulating layer 312 relative to the top of semiconductor die 300 to provide isolation from EMI, RFI, or other inter-device interference. By virtue of the V-shaped profile being cut into the organic material and shielding layer 310 extending into the profile, the shielding layer also isolates the sides of semiconductor die 300 from EMI, RFI, or other inter-device interference.

Semiconductor die 280 and 300 are vertically stacked and bonded with an adhesive layer 314, such as thermal epoxy, polymer composite, or inorganic bonding compounds. A portion of shielding layer 310 and insulating layer 312 is removed to form an opening like 218 in FIG. 7. Solder bump 316 is formed in the opening to electrically connect conductive THVs 288 and 308 and route electrical signals between semiconductor die 280 and 300. Solder bump 316 is electrically isolated from shielding layers 290 and 310. An interconnect structure is formed on the backside of semiconductor die 300, including RDLs 320, insulating layer 322, contact pads 324, and solder bumps 326 and 328.

The stacked semiconductor die are mounted to a top side of substrate 330 with solder bumps 326 and 328 contacting interconnect structure 332. Substrate 330 can be laminate, embedded die substrate, ceramics, or leadframe. The interconnect structure 332 includes signal traces, conductive layers, and dielectric layers. Contact pads 336 are formed on a backside of substrate 330 with electrical connection to interconnect structure 332. Solder bumps 338, 340, and 342 are formed on contact pads 336.

Shielding layer 290 electrically connects to an external ground point through bond wire 334, interconnect structure 332, contact pads 336, and solder bumps 340. Shielding layer 310 electrically connects to an external ground point through conductive layer 304, conductive THV 306, RDL 320, contact pad 324, solder bump 326, interconnect structure 332, contact pads 336, and solder bumps 328. Accordingly, shielding layers 290 and 310 are connected to external ground points through separate conductive paths. Other electrical signals are routed to and from semiconductor die 280 and 300 through contact pads 282 and 302, conductive layers 284 and 304, conductive THVs 288 and 308, and solder bump 316. The electrical signals are further routed through RDL 320, contact pad 324, solder bumps 328, interconnect structure 332, contact pad 336, and solder bumps 342 for external interconnectivity.

A molding compound or encapsulant 344 is deposited over semiconductor device 280 and 300, bond wires 334, and substrate 330. Molding compound 344 can be made with epoxy acrylate or other polymer material and applied by transfer molding, liquid encapsulant molding, or other molding process. Molding compound 344 is non-conductive and environmentally protects the semiconductor device from external elements and contaminants.

Figure 10:
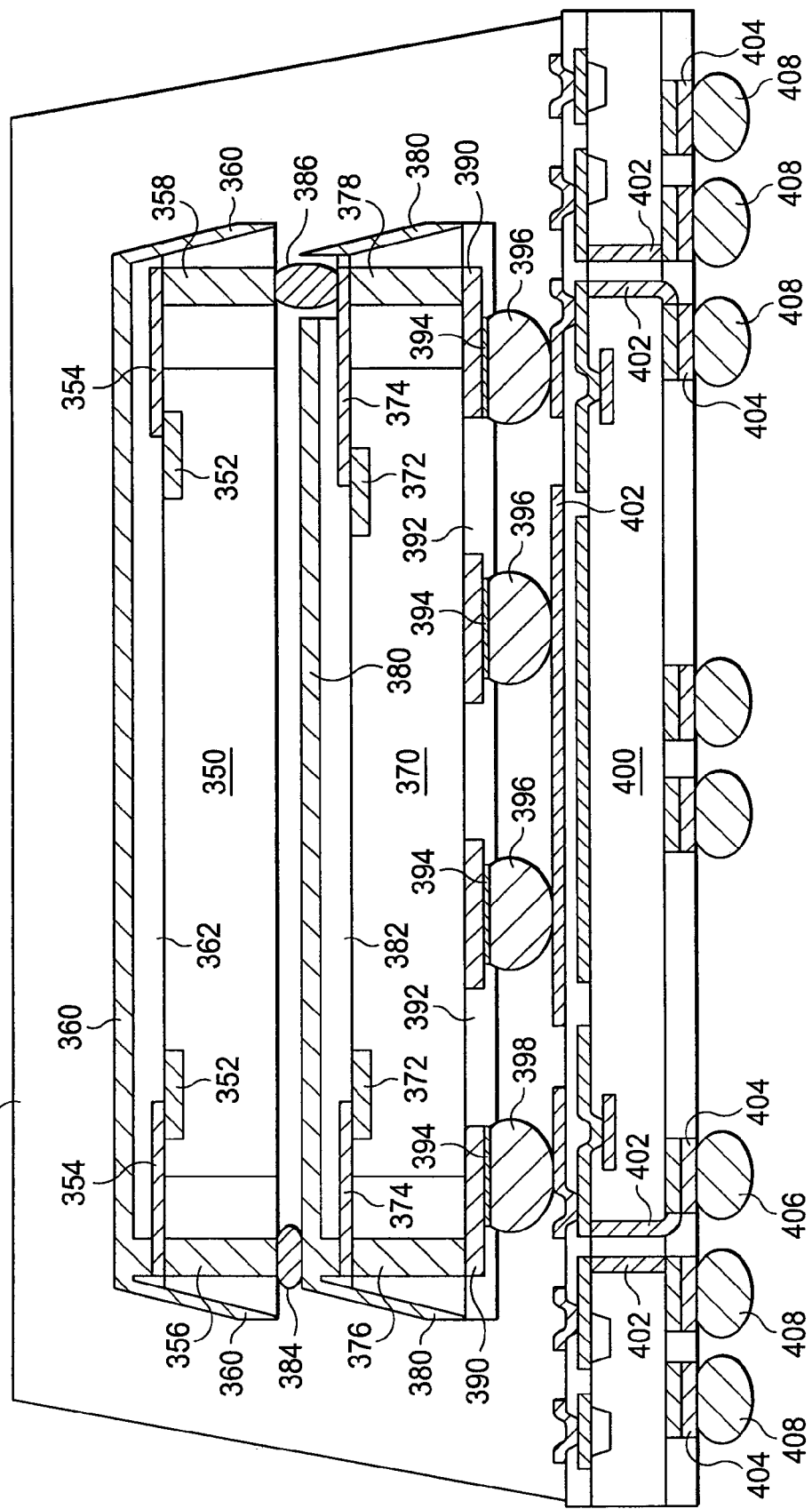
FIG. 10 illustrates vertically stacked semiconductor die each with a shielding layer formed along V-shaped profile and having common connection to external ground point.

FIG. 10 shows another PiP embodiment where the shielding layers have a common electrical connection to the external ground point. Semiconductor die 350 includes contact pads 352 electrically connected through conductive layer 354 to conductive THVs 356 and 358 which are formed in the organic material occupying the peripheral region around semiconductor die 350. Shielding layer 360 is formed over insulating layer 362. Shielding layer 360 also conforms to the V-shaped profile which is also formed in the organic material occupying the peripheral region around semiconductor die 350. Shielding layer 360 substantially covers all areas of insulating layer 362 relative to the top of semiconductor die 350 to provide isolation from EMI, RFI, or other inter-device interference. By virtue of the V-shaped profile being cut into the organic material and shielding layer 360 extending into the profile, the shielding layer also isolates the sides of semiconductor die 350 from EMI, RFI, or other inter-device interference.

Semiconductor die 370 include contact pads 372 electrically connected through conductive layer 374 to conductive THVs 376 and 378 which are formed in the organic material occupying the peripheral region around semiconductor die 370. Shielding layer 380 is formed over insulating layer 382. Shielding layer 380 also conforms to the V-shaped profile which is formed in the organic material occupying the peripheral region around semiconductor die 370. Shielding layer 380 substantially covers all areas of insulating layer 382 relative to the top of semiconductor die 370 to provide isolation from EMI, RFI, or other inter-device interference. By virtue of the V-shaped profile being cut into the organic material and shielding layer 380 extending into the profile, the shielding layer also isolates the sides of semiconductor die 370 from EMI, RFI, or other inter-device interference.

Semiconductor die 350 and 370 are vertically stacked and electrically connected with solder bumps 384 and 386. A portion of shielding layer 380 and insulating layer 382 is removed to form an opening like 218 in FIG. 7. Solder bump 386 is electrically isolated from shielding layers 360 and 380. Solder bump 386 is formed in the opening to electrically connect conductive THVs 358 and 378 and route electrical signals between semiconductor die 350 and 370. An interconnect structure is formed on the backside of semiconductor die 370, including RDLs 390, insulating layer 392, contact pads 394, and solder bumps 396 and 398.

The stacked semiconductor die are mounted to a top side of substrate 400 with solder bumps 396 and 398 contacting interconnect structure 402. Substrate 400 can be laminate, embedded die substrate, ceramics, or leadframe. The interconnect structure 402 includes signal traces, conductive layers, and dielectric layers. Contact pads 404 are formed on a backside of substrate 400 with electrical connection to interconnect structure 402. Solder bumps 406 and 408 are formed on contact pads 404.

Shielding layer 360 electrically connects shielding layer 380 through conductive layer 354, conductive THV 356, and solder bump 384. Shielding layer 380 electrically connects to an external ground point through conductive layer 374, conductive THV 376, RDL 390, contact pad 394, solder bump 398, interconnect structure 402, contact pads 404, and solder bumps 406. Thus, shielding layers 360 and 380 are both connected to the external ground point through a common conductive path, i.e., RDL 390, contact pad 394, solder bump 398, interconnect structure 402, contact pads 404, and solder bumps 406. Other electrical signals are routed to and from semiconductor die 350 and 370 through contact pads 352 and 372, conductive layers 354 and 374, conductive THVs 358 and 378, and solder bump 386. The electrical signals are further routed through RDL 390, contact pad 394, solder bumps 396, interconnect structure 402, contact pad 404, and solder bumps 408 for external interconnectivity.

A molding compound or encapsulant 410 is deposited over semiconductor device 350 and 370 and substrate 400. Molding compound 410 can be made with epoxy acrylate or other polymer material and applied by transfer molding, liquid encapsulant molding, or other molding process. Molding compound 410 is non-conductive and environmentally protects the semiconductor device from external elements and contaminants.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer having a plurality of semiconductor die;
   creating a gap between the semiconductor die to provide a peripheral region around the semiconductor die;
   depositing a first insulating material in the gap;
   forming a conductive via through the first insulating material in the gap;
   forming a conductive layer over the first insulating layer and semiconductor die, the conductive layer being electrically connected to the conductive via and a contact pad of the semiconductor die;
   depositing a second insulating layer over the first insulating layer, conductive layer, and semiconductor die;
   forming a profile in the first and second insulating layers in the peripheral region around the semiconductor die;
   forming an opening in the second insulating layer to expose the conductive layer;
   forming a shielding layer over the first and second insulating layers to isolate the semiconductor die from inter-device interference, the shielding layer conforming to the profile in the peripheral region around the semiconductor die and to the opening to electrically connect the shielding layer to the conductive via; and
   singulating the semiconductor wafer to separate the semiconductor die.

2. The method of claim 1, wherein the profile has a shape selected from the group consisting of tapered, V-shaped, truncated V-shape, flat, curved, and vertical.

3. The method of claim 1, further including electrically connecting the shielding layer to a ground point through the conductive via.

4. The method of claim 1, further including forming an interconnect structure on a backside of the semiconductor die opposite the contact pads, the interconnect structure being electrically connected to the conductive via.

5. The method of claim 1, further including removing a portion of the shielding layer and second insulating layer to expose the conductive layer.

6. The method of claim 1, further including:
   stacking first and second semiconductor die each having a shielding layer; and
   electrically connecting the shielding layer of the first semiconductor die and the shielding layer of the second semiconductor die to a ground point through separate conductive paths.

7. The method of claim 1, further including:
   stacking first and second semiconductor die each having a shielding layer; and
   electrically connecting the shielding layer of the first semiconductor die and the shielding layer of the second semiconductor die to a ground point through a common conductive path.

8. A method of making a semiconductor device, comprising:
   creating a gap between a plurality of semiconductor die, the gap providing a peripheral region around the semiconductor die;
   depositing a first insulating material in the gap;
   forming a conductive via through the first insulating material in the gap;
   depositing a second insulating layer over the first insulating layer and semiconductor die;
   forming a profile in the first and second insulating layers in the peripheral region around the semiconductor die; and forming a shielding layer over the first and second insulating layers to isolate the semiconductor die from inter-device interference, the shielding layer conforming to the profile in the peripheral region around the semiconductor die and being electrically connected to the conductive via.

9. The method of claim 8, further including:

forming a conductive layer over the semiconductor die, the conductive layer being electrically connected to the conductive via and a contact pad of the semiconductor die; and forming an opening in the second insulating layer to expose the conductive layer.

10. The method of claim 8, wherein the profile has a shape selected from the group consisting of tapered, V-shaped, truncated V-shape, flat, curved, and vertical.

11. The method of claim 8, further including electrically connecting the shielding layer to a ground point through the conductive via.

12. The method of claim 8, further including:

stacking first and second semiconductor die each having a shielding layer; and electrically connecting the shielding layer of the first semiconductor die and the shielding layer of the second semiconductor die to a ground point through separate conductive paths.

13. The method of claim 8, further including:

stacking first and second semiconductor die each having a shielding layer; and electrically connecting the shielding layer of the first semiconductor die and the shielding layer of the second semiconductor die to a ground point through a common conductive path.

14. A method of making a semiconductor device, comprising:

providing a semiconductor die having a peripheral region;

depositing a first insulating material in the peripheral region;

forming a conductive via through the first insulating material;

depositing a second insulating layer over the first insulating layer and semiconductor die;

forming a profile in the first and second insulating layers in the peripheral region around the semiconductor die; and forming a shielding layer over the first and second insulating layers to isolate the semiconductor die from inter-device interference, the shielding layer conforming to the profile in the peripheral region around the semiconductor die and being electrically connected to the conductive via.

15. The method of claim 14, further including:

forming a conductive layer over the semiconductor die, the conductive layer being electrically connected to the conductive via and a contact pad of the semiconductor die; and forming an opening in the second insulating layer to expose the conductive layer.

16. The method of claim 14, wherein the profile has a shape selected from the group consisting of tapered, V-shaped, truncated V-shape, flat, curved, and vertical.

17. The method of claim 14, further including electrically connecting the shielding layer to a ground point through the conductive via.

18. The method of claim 14, further including:

stacking first and second semiconductor die each having a shielding layer; and electrically connecting the shielding layer of the first semiconductor die and the shielding layer of the second semiconductor die to a ground point through separate conductive paths.

19. The method of claim 14, further including:

stacking first and second semiconductor die each having a shielding layer; and electrically connecting the shielding layer of the first semiconductor die and the shielding layer of the second semiconductor die to a ground point through a common conductive path.

* * * * *